United States Patent [19]

Costello et al.

[11] Patent Number: 5,357,825
[45] Date of Patent: Oct. 25, 1994

[54] COAXIAL INTEGRATED DEFORMABLE MIRROR ACTUATOR/RETRACTION ARRANGEMENT

[75] Inventors: Thomas P. Costello, Orlando; Ronald W. Stopher, Jupiter, both of Fla.

[73] Assignee: United Technologies Corporation, Hartford, Conn.

[21] Appl. No.: 150,568

[22] Filed: Nov. 9, 1993

Related U.S. Application Data

[63] Continuation of Ser. No. 895,489, Jun. 8, 1992, abandoned.

[51] Int. Cl.⁵ .................. H01L 41/00; G02B 5/08; G02B 7/18
[52] U.S. Cl. .................. 74/479 P; 310/311; 310/331; 310/328; 359/846; 359/849
[58] Field of Search .................. 74/479 R, 479 P; 310/331, 311, 328; 359/846, 849; 335/2.5

[56] References Cited

U.S. PATENT DOCUMENTS

| | | | |
|---|---|---|---|
| 3,551,764 | 12/1970 | Evans | 310/328 X |
| 4,160,184 | 7/1979 | Ljung | 310/328 |
| 4,202,605 | 5/1980 | Heinz | 350/292 |
| 4,408,832 | 10/1983 | Hartman et al. | 350/310 |
| 4,438,364 | 3/1984 | Morison | 310/331 X |
| 4,588,268 | 5/1986 | Aldrich | 350/607 |
| 4,742,261 | 5/1988 | Rich et al. | 310/328 |
| 4,940,318 | 7/1990 | Ealey et al. | 359/849 |
| 5,037,190 | 8/1991 | Ealey et al. | 359/849 X |
| 5,210,653 | 5/1993 | Schell | 359/846 |

FOREIGN PATENT DOCUMENTS

| | | |
|---|---|---|
| 3502024 | 7/1986 | Fed. Rep. of Germany . |
| 3502025 | 7/1986 | Fed. Rep. of Germany . |
| 2664712 | 1/1992 | France . |

*Primary Examiner*—Allan D. Herrmann

[57] ABSTRACT

An actuator device of particular use in changing the configuration of a deformable mirror faceplate includes an electrically deformable actuator confined between a grounded electrode disposed on a front surface of a support and an end cap of a tensioning unit which further includes an elongated tensioning element secured to the end cap and passing through a central opening of the actuator and a passage in the support with a free end portion thereof extending beyond the other surface of the support. A tensioning assembly for imposing a preloading force on the actuator includes an externally threaded sleeve surrounding and secured to the free end portion of the tensioning element, and an internally threaded nut meshing with the sleeve and acting on the support. The end cap and the tensioning element are electrically conductive to form a part of an electric drive circuit for the actuator, and the actuator has respective electrical contacts at its front and back faces in electrical contact with the end cap and the grounded electrode to complete the drive circuit.

15 Claims, 1 Drawing Sheet

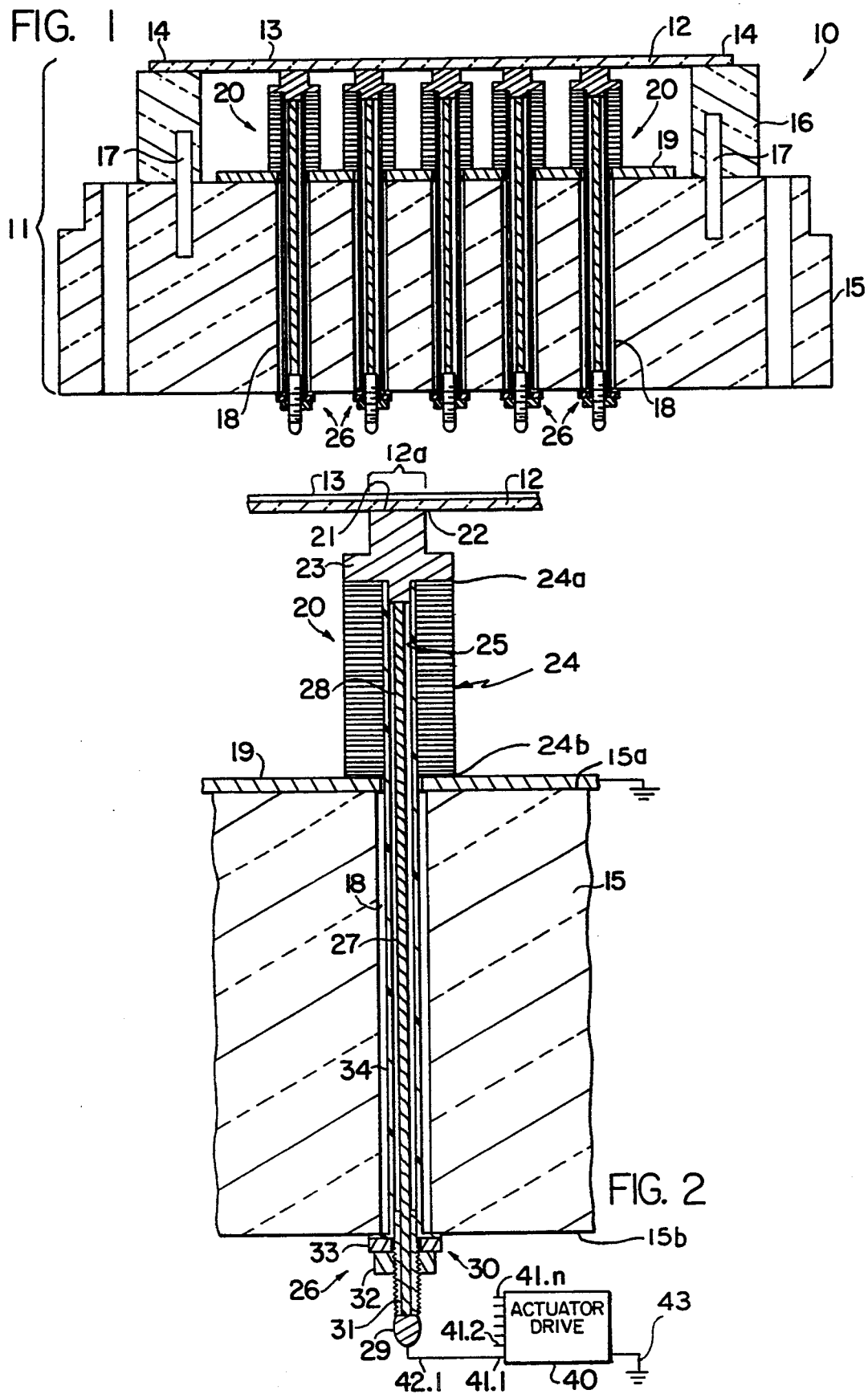

COAXIAL INTEGRATED DEFORMABLE MIRROR ACTUATOR/RETRACTION ARRANGEMENT

RELATED APPLICATIONS

This application is a continuation, under 37 C.F.R. | 1.62, of an application having a Ser. No. 07/895,489, filed on Jun. 8, 1992, now abandoned.

TECHNICAL FIELD

The field of the invention is that of adaptive optics and, in particular, the subfield of deformable mirrors.

BACKGROUND ART

In the field of adaptive optics, an essential component is a mirror including a faceplate that is provided with a reflective surface region and is capable of being deformed in a controlled fashion at any particular time during the use of the deformable mirror to correct for or to introduce phase errors or perturbations in the wavefront of the light beam that impinges on and is being reflected from the reflective surface region of the faceplate, by selectively regionally changing the effective optical path lengths when and as needed. The configuration of the faceplate, and hence that of its reflective surface region, at any given time is determined by the action of one or more of typically a large number of actuator devices on the faceplate, and the counteraction of a restoration or spring mechanism of one kind or another. In each case, the respective actuator device exerts an action force on an affected zone or subaperture of the faceplate at least when activated to displace such zone out of its initial position, and the restoration mechanism urges the affected faceplate zone, either directly or via the actuator device, in the opposite direction. When the action force changes at any particular time, the affected faceplate zone is displaced out of its previous position with attendant concurrent change in the reaction force, such displacement continuing until the action and reaction forces are in equilibrium again, albeit at a different force magnitude level, in the newly acquired position of the affected zone.

In this context, it is highly desirable if not crucial to assure that the action and reaction forces act on the affected faceplate zone in a substantially coaxial fashion along the centerline of the subaperture that is substantially normal to the reflective surface, to avoid subjecting the faceplate to undesirable force moments resulting in unwanted faceplate stresses and/or distortions. This, however, is not easy to accomplish, especially because the available volume is limited, typically amounting only to a few cubic centimeters.

There are already known many different types of deformable mirrors and of actuator devices capable of providing the faceplate deflection, but they all possess limitations of varying nature. So, for instance, various types of actuators are presently being used in deformable mirrors equipped with metal faceplates that are commonly used in high power applications where the capability of the metallic materials to withstand and operate at relatively high temperatures, coupled with their relatively high thermal conductivity making it possible to cool the faceplate by circulating a coolant past the back face of the faceplate, are important if not decisive considerations. On the other hand, metal faceplates have certain disadvantages that directly affect the performance parameters of the various components and have particularly undesirable effects in relatively low power applications. The large mass, high coefficient of thermal expansion, only moderate surfaceability, long term dimensional instability and environmental susceptibility of metals are all known drawbacks encountered when using metallic faceplates.

Traditional glass mirror faceplates avoid a number of these problems, but the materials used therefor are of relatively low strength and/or brittle. These qualities make it very difficult if not impossible to use such faceplates with actuator devices that employ coil springs or diaphragm plates to urge the affected faceplate zones to their initial positions, mainly because of the relatively high tensile stresses that these mechanisms impose on the faceplate.

To avoid such problems, deformable mirrors using faceplates of conventional optical glasses have been built by employing a "sandwich" structure in which the actuator device itself constitutes a stressed link in the structural path of the reaction or restoration force. This structure, however, results in tensile loading of the actuators, which are typically made of ceramic materials possessing very little mechanical strength in tension. The result has been that delamination of multilayer actuators has become a chronic problem in such structures. Moreover, in such a structure, replacement of any actuator that may have been damaged or is in need of replacement for some other reason requires extensive refurbishment of the entire structural assembly of such deformable mirror.

Accordingly, it is a general object of the present invention to avoid the disadvantages of the prior art.

More particularly, it is an object of the present invention to provide a mirror actuator device which does not possess the disadvantages of the known devices of this kind.

Still another object of the present invention is to develop the actuator device of the type here under consideration in such a manner as to be particularly suited for use in a deformable mirror assembly.

It is yet another object of the present invention to devise a deformable mirror assembly utilizing a plurality of actuator devices of the above type, in which the actuator devices can be easily adjusted.

A concomitant object of the present invention is to design the deformable mirror assembly of the above kind in such a manner as to be relatively simple in construction, inexpensive to manufacture, easy to use, and yet reliable in operation.

A yet further object of the present invention is to construct the mirror assembly and the actuator device of the above kinds in such a manner as to minimize the amount of space occupied thereby and the number of parts employed therein.

DISCLOSURE OF THE INVENTION

In keeping with these objects and others which will become apparent hereafter, one feature of the present invention resides in an actuator device for controllably adjusting the spacing of a positionable surface, especially such controlling the position of a zone of a mirror faceplate, from a support, such as a mirror substrate, that has front and back surfaces and a passage extending therethrough substantially normal to the front and back surfaces. The actuator device constructed in accordance with the invention includes an active element having front and back faces and an opening passing therethrough in extension of the passage in a mounted condition of the actuator device. The active element is of the type capable of undergoing dimensional changes when exposed to at least one of electric and magnetic fields. The actuator device further includes means for subjecting the active element to compression by a preload pressure. Such subjecting means includes an end element situated at the front face of the active element in the mounted condition and having the positioning surface, an elongated resilient preloading element extending through the opening and the passage in the mounted condition and having one end portion secured to the end element to constitute a preloading unit therewith, and another end portion remote from the one end portion, and tensioning means disposed at the other end portion of the preloading element and accessible from the back surface of the support in the mounted condition and operative for tensioning the preloading element to the extent necessary for the end element to apply the preload pressure to the front face of the active element. The actuator device also includes means for applying to the active element the one field of a controllably variable magnitude for adjusting the spacing to the desired extent.

In accordance with an additional facet of the present invention, the actuator device is to be used with a variable electric power source having two terminals, and the applying means includes one contact situated at the front surface of the support and electrically connected with one of the terminals in the mounted condition, front and back contacts located on the front and back faces of the active element in electrical contact with the end element and the one contact, respectively, and means for connecting the other of the terminals to the other end portion of the preloading element. In this case, the preloading unit is made to be electrically conductive to complete an electrical circuit between the other terminal and the front contact in the mounted condition.

A particular advantage of the actuator device construction according to the present invention as described so far is that, when the actuator device is used for deforming the faceplate of a deformable mirror, there is obtained a retraction mechanism that imposes relatively low stresses on the faceplate. Another important advantage, which stems from the inventive feature of using the tensioning unit as a part of one of the electrical leads for supplying electric power to the field applying means of the actuator device is that the resulting mirror or similar arrangement is very compact.

BRIEF DESCRIPTION OF THE DRAWINGS

Other features and advantages will be apparent from the specification and claims and from the accompanying drawings, in which:

FIG. 1 is a simplified partly cross-sectioned view of a deformable mirror assembly constructed in accordance with the present invention; and FIG. 2 is a view similar to FIG. 1 but at an enlarged scale and showing only a fragment of the deformable mirror assembly that includes only one actuator device embodying the present invention.

BEST MODE FOR CARRYING OUT THE INVENTION

Referring now to the drawing in detail, and first to FIG. 1 thereof, it may be seen therein that the reference numeral 10 has been used therein to identify a deformable mirror assembly constructed in accordance with the present invention. The mirror assembly 10 includes, as its main components, a substrate or support consisting of several parts collectively indicated at 11, a faceplate 12, and a number of actuator devices 20.

The faceplate 12 is flexible or deformable at least to some extent and has a surface region 13 that is reflective to incoming light or similar radiation. The reflectivity of the surface region 13 is obtained by resorting to any of a variety of known techniques, such as by depositing a reflective coating on the affected major surface of the faceplate 12. The faceplate 12 is made, for instance, of single crystal silicon and its peripheral or marginal portion 14 is supported on and secured to the substrate 11, for instance, by being bonded thereto. The substrate 11 is shown to consist of a substrate plate 15, a front and back surface, 15a and 15b and a support ring 16 which are held in proper position relative to one another by respective positioning pins 17 or a similar positioning arrangement. The material for the support ring 16 is chosen, among others, for its coefficient of thermal expansion in such a manner as to make the mirror assembly 10 substantially athermalized or, in other words, temperature variation independent. The substrate plate 15 has a number of through passages 18 each for accommodating a portion of one of the actuators 20. Furthermore, for a reason that will be presented later, a shared electrically conductive ground plate or layer 19 is provided on or at a major surface of the substrate plate 15 that faces toward the faceplate 12.

Turning now to FIG. 2 of the drawing as a basis for a more detailed description of the construction of one of the actuator devices 20 and its relationship relative to and cooperation with other components, it is to be mentioned first that, while the actuator device 20 is illustrated, and will be discussed below, as being incorporated or used in the deformable mirror assembly 10, it could also be employed in a variety of other applications in which it is desired to vary the distance of a front end face 21 of the reflective region of the actuator device 20 from a front major surface of the substrate plate 15 or, generally speaking, any similar support. It is to be mentioned in this context that the expressions "front" and "back" and other words or phrases of the same or similar import are being used herein to denote orientations or directions taken respectively toward and away from the incoming light beam in this application, or any object to be acted upon by the actuator device 20 in other applications.

In the illustrated application, the faceplate 12 and a faceplate zone 12a with the front end face 21 of the actuator device 20 are mechanically connected with one another, such as by being bonded to each other, as indicated by the presence therebetween of an adhesive layer 22 which may be electrically and/or thermally insulating. The front end face 21 is provided on an end cap 23 of the actuator device 20. The end cap 23 also has a rear end face that is shown to abut an associated front end face of an actuator 24 proper. The actuator 24 has a rear end face that is shown to be in area contact with a front major surface of the ground plate or layer 19. The actuator 24 may be of any known construction, such as laminated, electrostrictive, magnetostrictive, or piezoelectric, the only requirement in this respect being that the distance between the front and back faces 24a and 24b of the actuator 24 be variable in response to application thereto and as a function of the magnitude of mechanical forces, on the one hand, and of electric power or, generally speaking, electrostatic or electromagnetic field, on the other hand. The actuator 24 has a central opening 25 which, in the illustrated mounted position of the actuator device 20, is aligned with and forms an extension of the passage 18 of the substrate or support 15.

To hold the actuator device 20 together and in its proper mounted position, and especially to apply the aforementioned mechanical (pre-loading) forces to the actuator 24, there is provided a tensioning device 26 which includes, besides the end cap 23, an elongated tensioning element 27 having one end portion 28 secured to the end cap 23 and a transversely enlarged other end portion 29 and passing through and beyond the opening 25 and the passage 18, and a tensioning assembly 30 serving to impart the desired tension to the tensioning element 27 and, by means of the latter, the desired axial pre-loading force to the actuator 24. To this end, the tensioning element 27 is advantageously of a resiliently yieldable material, preferably of a metallic material such as titanium, and is typically constructed as a wire or braid of such material. The tensioning element 27 and the end cap 23 together constitute a tensioning unit.

The tensioning assembly 30 is basically arranged between the enlarged other end portion 29 of the tensioning element 27 and the back major surface of the substrate plate or support 15 and includes, as one of its components, an externally threaded sleeve 31 which surrounds a region of the tensioning element 27 adjoining, and engages, the enlarged other end portion 29, partially penetrating into the passage 18 of the support 15. The tensioning assembly 30 further includes a member 32 having an internal thread surrounding and meshing with a sleeve 31 having an external thread, and an annular spacer or washer 33 interposed between an abutment formation or nut 32 and the back major surface of the support 15. It should be evident that, when the nut 32 is turned in the tightening direction around the sleeve 31, the latter will brace itself against the enlarged end portion 29 and the nut 32 will press the washer 33 against the back major surface of the support 15 with a force increasing with the degree of tightening, and vice versa on loosening. The tensioning force thus imparted to the enlarged other end portion 29 is then transmitted through the elongated tensioning element 27 and applied via the end cap 23 to the actuator 24. Advantageously, the nut 32 may be tightened to such an extent that the actuator 24 is mechanically pre-loaded into about the middle of its operating range where its response to the applied electric power or electromagnetic field is, for all intents and purposes, linear.

As already mentioned before, the actuator 24 is to be subjected to electric power or electromagnetic field to vary its axial dimension (the distance between its front and back faces) relative to that existing initially under the aforementioned pre-tension, which means that electric current has to be supplied to the actuator 24. In accordance with an additional aspect of the present invention, this is accomplished in a relatively simple and particularly space-saving manner by using the tensioning unit consisting of the end cap 23 and the tensioning element 27 also as one of the electric leads to the actuator 24. Obviously, to be able to do this, the material or materials of the end cap 23 and of the tensioning element 27 has or have to be electrically conductive, as the material or materials proposed here are. Then, to incorporate actuator 24 into an electric circuit and/or to establish electrical continuity, the actuator 24 is provided at its oppositely facing end faces with respective front and back electric contacts that are in electric contact with the end cap 23 and a shared contact ground plate or layer 19, respectively.

The electric power required to individually energize the illustrated actuator 24 is furnished by an actuator drive 40 at its control terminal 41.1, and is shown to be supplied to the accessible end portion 29 of the actuator device 20 through an electric supply line 42.1 and a single first terminal or ground 43. The actuator drive 40 further includes a plurality of additional control terminals 41.2 to 41.$n$ (with n being the number of the actuator devices 20 to be individually addressed or driven), each being associated and connected, in a manner which has not been illustrated in the drawing in order not to unduly encumber the same, with other actuator devices 20. The actuator drive 40 is constructed and operated in any well-known manner to issue individual control or driving signals to its terminals 41.$a$ to 41.$n$, the magnitudes of such control or driving signals being such as to cause the actuator devices 20 collectively to impart the desired configuration to the faceplate 12 and thus to the reflective region 13 thereof. The thus established individual electric driving circuits for all of the actuator devices 20 are commonly completed through the ground plate or electrode 19 which is indicated to be connected to the electrical ground.

The actuator 24 may be of the piezoelectric, magnetostrictive or electrostrictive type. In each instance, the actuator 24 is capable of changing its axial dimension when electric power is supplied thereto, due to the influence of an electrostatic or electromagnetic field generated in response to such supply. In an illustrative embodiment, the actuator 24 was formed from doped lead magnesium niobate, such as the product commercially available from the AVX Corporation. In this embodiment, the actuator 24 had a diameter of 6 millimeters and a length of 10 millimeters, the tensioning element 27 was a wire with a diameter or gage of 0.02 inch, the enlarged end portion 29 was formed during electron beam welding that also secured the sleeve 31 to the wire 27, the compatible threads of the sleeve 31 and the nut 32 had 40 threads per inch, and the end cap 23 had an axial dimension of 0.12 inch.

As also depicted particularly in FIG. 2 of the drawing, a continuous protective sleeve, sheath or tube 34 is accommodated in the passage 18 and the opening 25, surrounding the electrically conductive and conducting element 27 over its entire portion extending between the end cap 23 and the nut 32. The tube 34 has electrically insulating properties, thus preventing arcing or other undesirable electrical phenomena from occurring between the element 27 and especially the ground plate or layer 19 and/or the actuator 24. Synthetic plastic materials, such as Teflon ™, have been found to be particularly suited for this purpose. When the substrate or support 15 is of an electrically non-conductive material, the protective sleeve or tube 34 need not extend throughout the length of the passage 18; rather, it would be sufficient for the protective sleeve 34 to extend out of the opening 25 into the passage 18 only to a certain extent sufficient to avoid contact or sparking between the element 27 and the plate or layer 19. Alternatively, the protective sleeve 34 could be replaced by an electrically insulating coating applied to any or all of the internal surfaces of the actuator 24, the plate or layer 19 and the support 15, or even by an electrically insulating coating applied to the external surface of the tensioning element 27 provided that the material of such protective coating does not suffer damage during the tensioning and/or relaxation of the tensioning element 27.

Having so described the construction of the deformable mirror assembly 10 and of the actuator device 20 used therein, the operation and use of the actuator devices 20 shown particularly in FIG. 2 of the drawing in the assembly 10 of FIG. 1 will now be explained in some detail. Initially, a preload force is applied to the tensioning element 27 by tightening the nut 32 until a known compressive preload force is applied to the actuator 24. The material of choice, titanium, has a relatively high Young's modulus, so that a relatively high preload force may be applied while still operating safely within the elastic deformation range of the elongated tensioning element 27.

After the completion of the pre-tensioning or preloading of all of the actuator devices 20, an electrical voltage of up to 150 volts is applied to the respective tensioning element 27 to provide a maximum installed stroke of approximately 6 micrometers. This electrical voltage is applied by the actuator drive 40 under the control of either a special purpose controller or a general purpose digital or analog computer, using well-known control principles.

It will be readily appreciated that the invention brings about certain advantages, such as the fact that actuator 24 is under compressive force, not tensile force. Further, the use of the elongated tensioning element 27 as both the force-applying element to apply the preload force to the actuator 24 and also as the electrical lead serves to make a very compact arrangement. The fact that the oppositely facing end faces of the actuator 24 are provided with the needed electrical contacts means that the maximum diameter of the actuator device 20 is that of the actuator 24, inasmuch as no external projections for electrical contact are required.

Another advantage is that, by using the approach proposed here, there is obtained an actuator to faceplate integration solution that imposes relatively low stresses on the faceplate and simultaneously maintains the structural integrity of the actuator. Furthermore, this proposed design uses or is compatible with traditional optical material and manufacturing processes. Additionally, the use of a single crystal silicon faceplate in conjunction with that of an optical class substructure and actuation mechanism results in a nearly athermalized mirror assembly. It should be understood that the invention is not limited to the particular embodiments shown and described herein, but that various changes and modifications may be made without departing from the spirit and scope of this novel concept as defined by the following claims.

We claim:

1. An actuator device wherein said actuator device controllably adjusts a spacing of a zone of a mirror faceplate from a substrate that has front and back surfaces facing toward and away from the faceplate, respectively, said substrate further having, a passage extending therethrough substantially normal to the front and back surfaces, said actuator device comprising
   an active element having front and back faces facing the faceplate zone and the front surface of the substrate, respectively, and an opening passing therethrough in extension of the passage, said active element being capable of undergoing dimensional changes when exposed to at least one of electric and magnetic fields;
   means for subjecting said active element to compression, including
      an end element interposed between said front face of said active element and the faceplate zone,
      an elongated resilient preloading element extending through said opening and the passage and having one end portion secured to said end element to constitute a preloading unit therewith, and another end portion remote from said one end portion, and
   tensioning means disposed at to said another end portion of said preloading element and accessible from the back surface of the substrate for tensioning said preloading element to the extent necessary for said end element to apply a preload pressure to said front face of said active element, said tensioning means including an abutment formation secured to and having a transverse size exceeding that of to said another end portion of said preloading element, a tensioning device surrounding to said another end portion of said preloading element between said abutment formation and the back surface of the substrate and having an internal thread, and a sleeve disposed in said tensioning device around said other end portion of said preloading element and having an external thread meshing with said internal thread of said tensioning device for said tensioning device to brace itself against the back surface of the substrate and cause said sleeve to engage said abutment formation and exert a tensioning force thereon; and
   means for applying to said active element said one field of a controllably variable magnitude for adjusting the spacing to the desired extent.

2. The actuator device as defined in claim 1, and further comprising means for connecting the faceplate zone to said end element for joint movement therewith.

3. The actuator device as defined in claim 1, wherein said tensioning device includes a nut having said internal thread, and an annular spacer interposed between said nut and the back surface.

4. An actuator device wherein said actuator device controllably adjusts a spacing of a zone of a mirror faceplate from a substrate that has front and back surfaces facing toward and away from the faceplate, respectively, said substrate further having, a passage extending therethrough substantially normal to the front and back surfaces, said actuator device comprising
   an active element having front and back faces facing the faceplate zone and the front surface of the substrate, respectively, and an opening passing therethrough in extension of the passage, said active element being capable of undergoing dimensional changes when exposed to at least one of electric and magnetic fields;
   means for subjecting said active element to compression, including
      an end element interposed between said front face of said active element and the faceplate zone,
      an elongated resilient preloading element extending through said opening and the passage and having one end portion secured to said end element to constitute a preloading unit therewith, and another end portion remote from said one end portion, said preloading unit being electrically conductive, and tensioning means disposed at to said another end portion of said preloading element and accessible from the back surface of the substrate for tensioning said preloading element to the extent necessary for said end element to apply a preload pressure to said front face of said active element; and means for applying to said active element said one field of a controllably variable magnitude for adjusting the spacing to the desired extent, said applying means including a variable electric power source having two terminals, a first contact situated at the front surface of the substrate and electrically connected with one of said terminals, front and back contacts located on said front and back faces of said active element in electrical contact with said end element and said first contact, respectively, and means for connecting the other of said terminals to said another end portion of said preloading element for said electrically conductive preloading unit to complete an electrical circuit between said other terminal and said front contact.

5. The actuator device as defined in claim 4, and further comprising a tubular electrically insulating sheath surrounding at least that portion of said preloading unit that is accommodated in said opening and passes by said one contact to electrically insulate said preloading unit from said active member and said one contact.

6. A mirror assembly comprising
   a mirror faceplate;
   a substrate having front and back surfaces facing toward and away from the faceplate, respectively, and a plurality of passages extending through the substrate substantially normal to said front and aback surfaces; and
   a plurality of actuator devices each for controllably adjusting a spacing of an associated zone of the faceplate from the front surface of the substrate and each including
      an active element having front and back faces facing said associated faceplate zone and said front surface of said substrate, respectively, and an opening passing therethrough in extension of an associated one of said passages, said active element being capable of undergoing dimensional changes when exposed to at least one of electric and magnetic fields,
   means for subjecting said active element to compression, including
      an end element interposed between said front face of said active element and the faceplate zone,
      an elongated resilient preloading element extending through said opening and said associated passage and having one end portion secured to said end element to constitute a preloading unit therewith, and another end portion remote from said one end portion, and
      tensioning means disposed at said other end portion of said preloading element and accessible from said back surface of said substrate for tensioning said preloading element to the extent necessary for said end element to apply a preload pressure to said front face of said active element, said tensioning means of each of said actuator devices including an abutment formation secured to and having a transverse size exceeding that of said other end portion of said preloading element, a tensioning device surrounding said other end portion of said preloading element between said abutment formation and said back surface of said substrate and having an internal thread, and a sleeve disposed in said tensioning device around said other end portion of said preloading element and having an external thread meshing with said internal thread of said tensioning device for said tensioning device to brace itself against said back surface of said substrate and cause said sleeve to engage said abutment formation and exert a tensioning force thereon; and
   means for individually applying to each of said active element said one field of a controllably variably magnitude for adjusting spacings to the desired extent.

7. The mirror assembly as defined in claim 6, and further comprising means for connecting each of said associated faceplate zones to an associated one of said end elements for joint movement therewith.

8. The mirror assembly as defined in claim 6, wherein said tensioning device of each of said actuator devices includes a nut having said internal thread, and an annular spacer interposed between said nut and said back surface.

9. The mirror assembly as defined in claim 6, wherein said faceplate is resiliently deformable and has a central portion including all of said associated zones and a peripheral portion extending around said central portion; and further comprising means for connecting said faceplate at said peripheral portion thereof to said substrate for said actuator devices collectively to deform said faceplate in a manner determined by the spacing adjustments imposed by said adjustment devices on said affected zones of said central portion of said faceplate.

10. A mirror assembly comprising:
   a mirror faceplate;
   a substrate having front and back surfaces facing toward and away from the faceplate, respectively, and a plurality of passages extending through the substrate substantially normal to said front and back surfaces; and
   a plurality of actuator devices each for controllably adjusting a spacing of an associated zone of the faceplate from the front surface of the substrate and each including
      an active element having front and back faces facing said associated faceplate zone and said front surface of said substrate, respectively, and an opening passing therethrough in extension of an associated one of said passages, said active element being capable of undergoing dimensional changes when exposed to at least one of electric and magnetic fields,
   means for subjecting said active element to compression, including
      an end element interposed between said front face of said active element and the faceplate zone,
      an elongated resilient preloading element extending through said opening and said associated passage and having one end portion secured to said end element to constitute a preloading unit therewith, and another end portion remote from said one end portion, said preloading unit of each of said actuator devices being electrically conductive, and
      tensioning means disposed at said other end portion of said preloading element and accessible from said back surface of said substrate for tensioning said preloading element to the extent necessary for said end element to apply a preload pressure to said front face of said active element; and means for individually applying to each of said active element said one field of a controllably variably magnitude for adjusting spacings to the desired extent, said applying means including a variable electric power source having a single first terminal and a plurality of second terminals each supplied with an individually variable amount of electric power, one shared contact situated at said front surface of said substrate and electrically connected with said first terminal, front and back contacts located on said front and back faces of each of said active elements in electrical contact with the associated one of said end elements and said one shared contact, respectively, and means for individually connecting an associated one of said second terminals to said other end portion of a different one of said preloading elements for each of said electrically conductive preloading units to complete an individual electrical circuit between one of said front contact and said second terminal associated therewith.

11. The mirror assembly as defined in claim 10, wherein each of said actuator devices further includes a tubular electrically insulating sheath surrounding at least that portion of the respective preloading unit that is accommodated in the respective opening and passes by said shared contact to electrically insulate said preloading unit from said active member and said shared contact.

12. An actuator device mounted on a support having front and back surfaces and a passage extending therethrough substantially normal to the front and back surfaces, said actuator device comprising an active element having front and back faces that face away from and toward the front surface of the support, respectively, and an opening passing therethrough in extension of the passage in the mounted condition, said active element being capable of undergoing dimensional changes when exposed to at least one of electric and magnetic fields;

means for subjecting said active element in the mounted condition thereof to compression, including an end element having a back face and a front face facing toward and away from said front face of said active element in the mounted condition, an elongated resilient preloading element extending through said opening and the passage in the mounted condition and having one end portion secured to said end element to constitute a preloading unit therewith, and another end portion remote from said one end portion, and tensioning means disposed at said other end portion of said preloading element and accessible from the back surface of the support in the mounted condition for tensioning said preloading element to the extent necessary for said end element to apply a preload pressure to said front face of said active element, said tensioning means including an abutment formation secured to and having a transverse size exceeding that of said other end portion of said preloading element, a tensioning device surrounding said other end portion of said preloading element between said abutment formation and the back surface of the support in the mounted condition and having an internal thread, and a sleeve disposed in said tensioning device around said other end portion of said preloading element and having an external thread meshing with said internal thread of said tensioning device in the mounted condition for said tensioning device to brace itself against the back surface of the support and cause said sleeve to engage said abutment formation and exert a tensioning force thereon; and means for applying to said active element in the mounted condition thereof said one field of a controllably variable magnitude for adjusting the spacing of said front face of said end element from the front surface of the support to the desired extent.

13. The actuator device as defined in claim 12, wherein said tensioning device includes a nut having said internal thread, and an annular spacer interposed between said nut and the back surface in the mounted condition.

14. An actuator device in combination with a variable electric power source having two terminals, said actuator device mounted on a support having front and back surfaces and a passage extending therethrough substantially normal to the front and back surfaces, and, comprising an active element having front and back faces that face away from and toward the front surface of the support, respectively, and an opening passing therethrough in extension of the passage in the mounted condition, said active element being capable of undergoing dimensional changes when exposed to at least one of electric and magnetic fields;

means for subjecting said active element in the mounted condition thereof to compression, including an end element having a back face and a front face facing toward and away from said front face of said active element in the mounted condition, an elongated resilient preloading element extending through said opening and the passage in the mounted condition and having one end portion secured to said end element to constitute a preloading unit therewith, and another end portion remote from said one end portion, and tensioning means disposed at said other end portion of said preloading element and accessible from the back surface of the support in the mounted condition for tensioning said preloading element to the extent necessary for said end element to apply a preload pressure to said front face of said active element; and means for applying to said active element in the mounted condition thereof said one field of a controllably variable magnitude for adjusting the spacing of said front face of said end element from the front surface of the support to the desired extent, said applying means including one contact situated at the front surface of the support and electrically connected with one of the terminals in the mounted condition, front and back contacts located on said front and back faces of said active element in electrical contact with said end element and said one contact, respectively, and means for connecting the other of said terminals to said other end portion of said preloading element, and said preloading unit being electrically conductive to complete an electrical circuit between said other terminal and said front contact in said mounted condition.

15. The actuator device as defined in claim 14, and further comprising a tubular electrically insulating sheath surrounding at least that portion of said preloading unit that is accommodated in said opening and passes by said one contact in the mounted condition to electrically insulate said preloading unit from said active member and said one contact.

* * * * *